United States Patent [19]

Chi-Mao

[11] Patent Number: 5,541,597
[45] Date of Patent: Jul. 30, 1996

[54] DIGITAL/ANALOG CONVERTER FOR COMPENSATION OF DC OFFSET

[75] Inventor: Huang Chi-Mao, Dou-Liew, Taiwan

[73] Assignee: United Microelectronics Corp., Hsin-Chu, Taiwan

[21] Appl. No.: 303,794

[22] Filed: Sep. 9, 1994

[51] Int. Cl.[6] .................................................. H03M 1/06
[52] U.S. Cl. ........................................ 341/118; 341/144
[58] Field of Search ................................ 341/118, 120, 341/144; 381/68.4, 106

[56] References Cited

U.S. PATENT DOCUMENTS

| | | | |
|---|---|---|---|
| 4,563,670 | 1/1986 | Stallkamp et al. | 341/144 |
| 4,807,161 | 2/1989 | Comfort et al. | 364/550 |
| 5,278,912 | 1/1994 | Waldhauer | 381/68.4 |

*Primary Examiner*—Brian K. Young
*Attorney, Agent, or Firm*—Barnes, Kisselle, Raisch, Choate, Whittemore & Hulbert, P.C.

[57] ABSTRACT

A digital/analog converter circuit of the analog multiplying type utilizing the major components of an analog multiplying current source and a DC offset compensation circuit for eliminating noise generation.

9 Claims, 1 Drawing Sheet

TONE

ENVELOPE

DIGITAL/ANALOG CONVERTER FOR COMPENSATION OF DC OFFSET

FIELD OF THE INVENTION

The present invention generally relates to a circuit for a digital/analog converter and more particularly, relates to a digital/analog converter circuit of the analog multiplying type that can be used to compensate DC offset and eliminate noise.

BACKGROUND OF THE INVENTION

In a conventional method of synthesizing melody, a melody is first divided into a tone wave and an envelope wave and then the two waves are multiplied together to form a synthesized sound wave. This is shown in FIGS. 1–3. FIG. 1 shows a tone wave 10 plotted as a voltage vs time curve. An envelope wave is shown in FIG. 2 which is also plotted as a voltage vs time curve. Multiplying the tone wave 10 in FIG. 1 by the envelope wave 20 in FIG. 2, a composite sound wave 30 is obtained which is shown in FIG. 3. It should be noted that the composite sound wave 30 shown in FIG. 3 is obtained under ideal conditions, i.e. it is a hypothetical waveform.

In reality, the composite waveform 30 is more likely to resemble the shape of the waveform 40 shown in FIG. 4. This departure from the ideal form is mainly caused by the lack of adjustment for the DC voltage offset.

Traditionally, a melody can be synthesized by two methods. The first is a digital synthesizing method in which the digital data of the tone wave and the envelope wave are multiplied together by using a multiplier. The product of the multiplication is then sent to a digital/analog converter in order to complete the synthesis of the melody wave. The shortcomings of this method is that it requires the additional component of a multiplier and a higher operating frequency range for the conversion system.

The second method of synthesizing a melody wave is the analog synthesizing method. However, due to the lack of adjustment for the voltage offset and the lack of adequate positive/negative signal processing of the digital/analog converter, a distorted sound wave is frequently generated. This is shown in FIG. 4. The sound wave 40 shown in FIG. 4 contains a variable DC offset which is frequently the cause of an undesirable "pop" noise during the playback of the melody. In order to eliminate the "pop" noise, at least one coupling capacitor must be used to eliminate the DC component. This in turn increases the cost of the circuit.

It is therefore an object of the present invention to provide a digital/analog converter circuit of the analog multiplying type that does not have the shortcomings of the prior art digital/analog converter circuits.

It is another object of the present invention to provide a digital/analog converter circuit of the analog multiplying type that utilizes an analog synthesized circuit.

It is a further object of the present invention to provide a digital/analog converter circuit of the analog multiplying type that utilizes an analog synthesizing method and a DC offset compensator to compensate for DC offset.

It is yet another object of the present invention to provide a digital/analog converter circuit of the analog multiplying type utilizing an analog synthesizing method and a DC offset compensator to compensate for DC offset and to eliminate noise formation.

SUMMARY OF THE INVENTION

In accordance with the present invention, an improved digital/analog converter circuit of the analog multiplying type is provided.

In the preferred embodiment, the digital/analog converter includes a DC offset compensator circuit to eliminate any noise formation. The circuit comprises two major elements of an analog multiplying current source and a DC offset compensator circuit.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

The present invention of a digital/analog converter circuit of the analog multiplying type consists of two major functional blocks, namely, an analog multiplying current source and a DC offset compensator circuit. A circuit diagram of the current source and the compensator are shown in FIG. 5.

Figure 5:
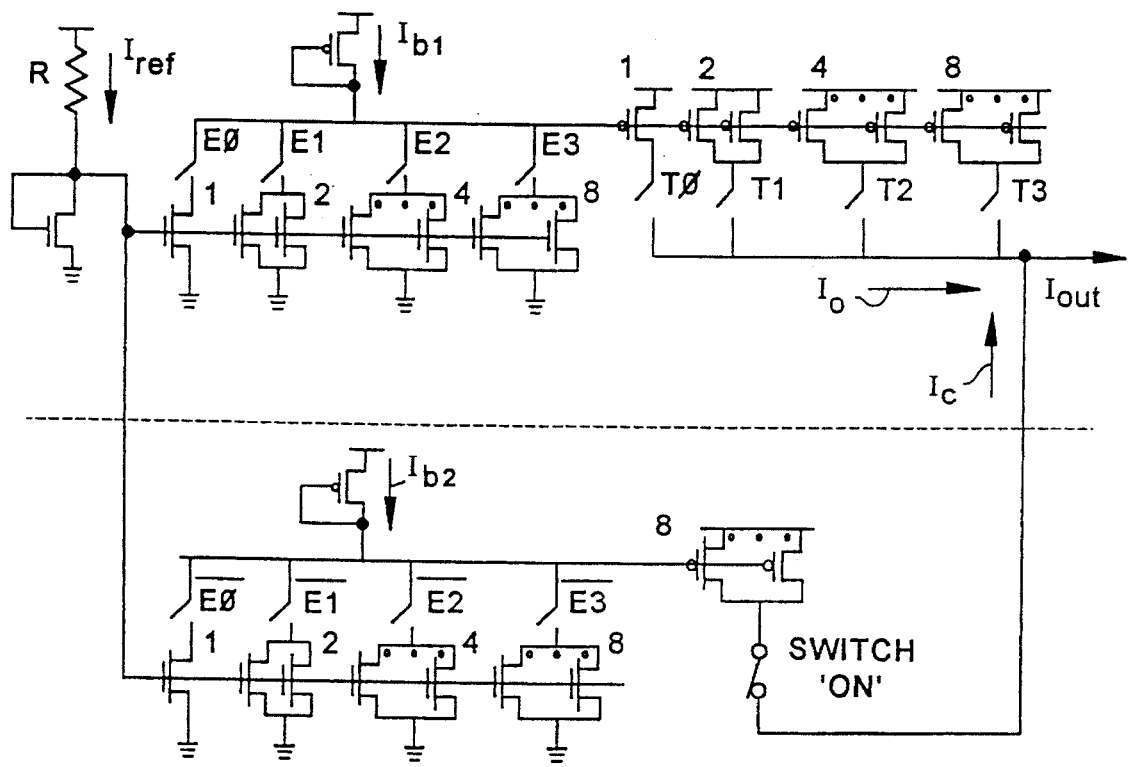
FIG. 5 is a circuit diagram of the present invention showing an analog multiplying current source and a DC offset compensator.

The cause for the formation of the DC offset is first analyzed and a solution is proposed by the present invention analog multiplying type of digital/analog converter. In FIG. 5, two major components of the present invention, i.e., an analog multiplying type digital/analog converter and a DC offset compensator are shown. In the following illustration, an example of 4 bits×4 bits is given. The functions of the present invention are defined as follows:

Assuming that the switch shown in FIG. 5 is "on" when the control signal is "1", and the switch is "off" when the control signal is "0", $I_{ref} = N(R)$ where I is a function of R $I_{b1} = E \times I_{ref}$ where $I_{b1}$ is a multiple of $I_{ref}$ depending on the values of $E_0$–$E_3$ of the envelope curve $I_0 = T \times I_{b1}$ where $I_0$ is a multiple of $I_{b1}$ depending on the values of $T_0$–$T_3$ of the tone curve therefore, $$\begin{aligned} I_0 \text{ (before DC offset compensation)} &= T \times I_{b1} \\ &= T \times E \times I_{ref} \\ &= T \times E \times N(R) \end{aligned}$$

Figure 4:
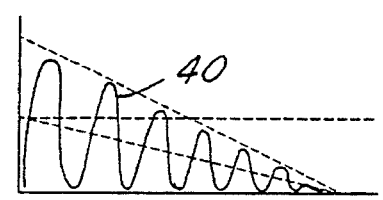
FIG. 4 is a graph showing a real direct composite sound wave.

By this method, the results obtained by multiplying the tone and the envelope analog data together can be obtained. The tone data and the envelope data may be interchanged which has no effect on the result. The waveform synthesized is shown in FIG. 4 where the DC offset produces a "pop" noise. Even though the noise may be avoided by using a specially designed circuit to filter out the DC component, the solution is less than desirable due to the higher cost involved.

In the analog multiplying current source, two sets of registers are used. The first set of register is used to control the input of the envelope signals $E_3 \sim E_0$. The second set of register is used to control the input of the tone signals $T_3 \sim T_0$. These are shown in FIG. 5. The value of the resistor R is used to adjust the value of $I_{b1}$ while the magnitude of the $I_{b2}$ current is controlled by $\overline{E}_3 \sim \overline{E}_0$. The magnitude of the output $I_0$ is controlled by $T_3 \sim T_0$. The value of $I_0$ is proportional to the product of the envelope wave and the tone wave values. The value of $I_0$ further includes a variable DC offset and therefore, resembles the curve shown in FIG. 4. In order to obtain a value that has a fixed DC offset, i.e., like that shown in FIG. 3, a DC offset compensator circuit (shown in FIG. 5) must be utilized. The value used to compensate DC offset is inversely proportional to the magnitude of the envelope. For instance, a smaller value to compensate is needed when the envelope is large while a larger value to compensate is needed when the envelope is small. As shown in FIG. 5, the switch $E_3E_2E_1E_0/\overline{E}_3\overline{E}_2\overline{E}_1\overline{E}_0$ for controlling $Ib_1$ and $Ib_2$ has an inverse relationship.

Figure 1:
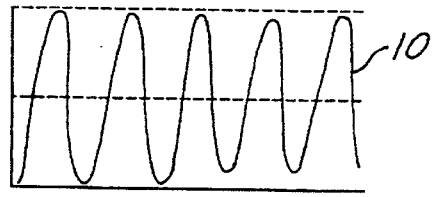
FIG. 1 is a graph showing the tone wave component of a sound wave.
Figure 2:
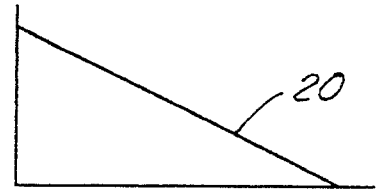
FIG. 2 is a graph showing the envelope wave component of a sound wave.
Figure 3:
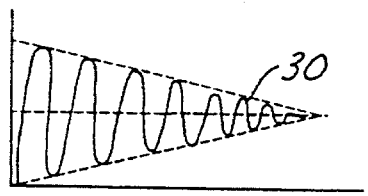
FIG. 3 is a graph showing a hypothetical composite sound wave.

A desirable waveform obtained by completely eliminating DC offset noise is shown in FIG. 3. The reference point for the DC offset ($8 \times 15 \times I_{ref}$) is obtained by multiplying the median value of the tone curve with the maximum value of the envelope curve. When the tone curve is at its median value, regardless how the value of the envelope curve changes, as long as the product of the two values is the same as the reference point of the DC offset, the "pop" noise can be avoided.

The reason for generating a DC offset in the previous example where no suitable compensation was made can be explained as follows:

As shown in FIG. 5, assuming that a control signal of "1" means the switch is "on", "0" means the switch is "off", the median value of the tone curve is the reference point and that $(T_3, T_2, T_1, T_0) = (1, 0, 0, 0)$. The data obtained are presented in Table 1.

TABLE 1

| $E_3$ | $E_2$ | $E_1$ | $E_0$ | $I_0$ | (Value of $I_c$ Compensation) | |
|---|---|---|---|---|---|---|
| 1 | 1 | 1 | 1 | $15 \times 8 \times I_{ref}$ | $0 \times 8 \times I_{ref}$ | DC Offset |
| 1 | 1 | 1 | 0 | $14 \times 8 \times I_{ref}$ | $1 \times 8 \times I_{ref}$ | ref. point |
| . | . | . | . | . | . | |
| . | . | . | . | . | . | |
| 1 | 0 | 0 | 1 | $9 \times 8 \times I_{ref}$ | $6 \times 8 \times I_{ref}$ | |
| 1 | 0 | 0 | 0 | $8 \times 8 \times I_{ref}$ | $7 \times 8 \times I_{ref}$ | |
| 0 | 1 | 1 | 1 | $7 \times 8 \times I_{ref}$ | $8 \times 8 \times I_{ref}$ | |
| . | . | . | . | . | . | |
| . | . | . | . | . | . | |
| 0 | 0 | 0 | 1 | $1 \times 8 \times I_{ref}$ | $14 \times 8 \times I_{ref}$ | |
| 0 | 0 | 0 | 0 | $0 \times 8 \times I_{ref}$ | $15 \times 8 \times I_{ref}$ | |

When the envelope value changes, the $I_0$ which can be taken as the uncompensated median value will offset. This generates continuing "pop" noise during a synthesis of the music/voice. It is therefore necessary to compensate for the offset value ($I_c$) in order to maintain the DC offset at a fixed value i.e., at the median reference point. The "pop" noise can therefore be eliminated.

The value for compensation can be provided by a simple DC offset compensator as that shown in FIG. 5. The circuit for the bias is similar to a D/A converter of the analog multiplying type. The main difference is that the on/off position of the switch is reversed such that the bias value is fixed, i.e., $I_{b1}+I_{b2}=15 \times I_{ref}$. In the output circuit, a value of $8 \times I_{b2}$ which is the median reference point of the tone curve, i.e., the magnitude of $(T_3, T_2, T_1, T_0)=(1, 0, 0, 0)$, is the value used for the DC offset compensation. In reference to the median value of tone $T_3=1$, the number of PMOS used in the compensation circuit corresponds to the eight PMOS of $T_3$ in order to fix the bias at $Ib_1+Ib_2=15 \times I_{ref}$. In the NMOS part of the compensator circuit, the ON/OFF of the switch is inverse to $E_3E_2E_1E_0$ for controlling $Ib_1$ such that a DC offset compensation is achieved.

While the present invention has been described in an illustrative manner, it should be understood that the terminology used is intended in a nature of words of description rather than of limitation.

Furthermore, while the present invention has been described in terms of one preferred embodiment thereof, it is to be appreciated that those skilled in the art will readily apply these teaches to other possible variations of the invention.

The embodiments of the invention in which an exclusive property or privilege is claimed are defined as follows:

1. A digital/analog converter circuit of the analog multiplying type, comprising an analog multiplying current source utilizing an envelope wave signal to determine a DAC bias current and a tone signal to control an output current where the magnitude of said output current is proportional to the product of the envelope wave and the tone wave and a circuit for compensating a DC offset in said analog multiplying current source, for eliminating noise generated by variations in said DC offset.

2. A circuit according to claim 1, wherein said DC offset compensation circuit supplies a compensation current by an analog multiplying current D/A converter.

3. A circuit according to claim 1, wherein said DC offset compensation circuit compensates for the offset variation caused by various envelope values such that a fixed DC offset value is maintained.

4. A circuit according to claim 1, wherein said envelope and tone signals of the analog multiplying current source are reversed.

5. A circuit according to claim 1, wherein an input for said tone signal is used for a tone/voice/speech data and an input for said envelope signal is used to control a volume such that a multiple stage volume controlled music synthesizer can be achieved without DC offset.

6. A digital/analog converter circuit of the analog multiplying type comprising:

an analog multiplying current source for using an envelope signal to determine the DAC bias current, a tone signal for controlling an output current the magnitude of which is proportional to the product of the envelope signal and the tone signal, and a DC offset compensation circuit for outputting a compensation current for compensating a DC offset variation caused by different envelope values in order to maintain a fixed DC offset value.

7. A circuit according to claim 6, wherein said envelope signal and said tone signal of the analog multiplying current source are reversed.

8. A method to compensate a DC offset and to eliminate noise generation, comprising the steps of:

determining a DAC bias current by using an envelope signal from an analog multiplying current source, controlling an output current of said analog multiplying current source by using a signal having a magnitude proportional to the product of said envelope signal and a tone signal, and compensating a DC offset variation caused by different envelope values by a compensation current obtained from a DC offset compensation circuit such that a fixed DC offset value is maintained and any noise generation is eliminated.

9. A method to compensate a DC offset and to eliminate noise generation according to claim 8, wherein said step of determining a DAC bias current is accomplished by using a tone signal from an analog multiplying current source, said step of controlling an output current is accomplished by using an envelope signal having a magnitude proportional to the product of the envelope signal and the tone signal.

* * * * *